(12) United States Patent
Venaleck et al.

(10) Patent No.: US 6,316,954 B1
(45) Date of Patent: Nov. 13, 2001

(54) HIGH PERFORMANCE TEST INTERFACE (75) Inventors: John T. Venaleck, Painesville, OH (US); John Tengler, Chico, CA (US); Alan L. Roath, Madison, OH (US)

(73) Assignee: Ohio Associated Enterprises, Inc., Painesville, OH (US)

( * ) Notice: Subject to any disclaimer, the term of this patent is extended or adjusted under 35 U.S.C. 154(b) by 0 days.

(21) Appl. No.: 09/352,797

(22) Filed: Jul. 13, 1999

Related U.S. Application Data (60) Provisional application No. 60/092,610, filed on Jul. 13, 1998.

(51) Int. Cl.[7] .................................................. G01R 31/02
(52) U.S. Cl. ............................................................ 324/761
(58) Field of Search ................... 324/761, 755, 324/754, 760, 763

(56) References Cited

U.S. PATENT DOCUMENTS

| | | |
|---|---|---|
| 3,714,572 | 1/1973 | Ham et al. . |
| 4,782,289 | 11/1988 | Schwar et al. . |
| 4,870,354 | 9/1989 | Davaut . |
| 5,027,063 | 6/1991 | Letourneau . |
| 5,434,513 | 7/1995 | Fujii et al. . |
| 5,537,051 | 7/1996 | Jalloul et al. . |
| 5,677,636 | 10/1997 | Slocum et al. . |
| 5,821,764 | 10/1998 | Slocum et al. . |
| 5,945,837 | * 8/1999 | Fredrickson .................... 324/761 |

* cited by examiner

*Primary Examiner*—Safet Metjahic
*Assistant Examiner*—J Kerveros
(74) *Attorney, Agent, or Firm*—Renner, Otto, Boisselle & Sklar, LLP (57) ABSTRACT

A test interface is used to connect an electronic device under test ("DUT"), such as a computer chip, to a tester. The interface utilizes a combination of spring forces and air pressure forces to extend and retract pogo pins, respectively. The pogo pins when extended contact conductive pads which are electrically connected to the DUT, perhaps via a DUT board. Springs are biased to extend the pins to contact the pads, and air pressure is used to retract the pins. Thus no air pressure or vacuum is required to maintain the pins in contact with the pads. When retracted, the pogo pins are shielded from damage by a shield, such as a board with holes in it for the pogo pins to pass through.

14 Claims, 12 Drawing Sheets

HIGH PERFORMANCE TEST INTERFACE

This application claims priority from U.S. Provisional Patent Application Serial No. 60/092,610, filed Jul. 13, 1998

TECHNICAL FIELD OF THE INVENTION

The invention involves devices for testing electronic components such as computer chips (sometimes referred to as integrated circuits) and/or other electrical and electronic devices, and, more particularly, to test interfaces which connect to a tester a circuit board upon which an electronic device is mounted.

DESCRIPTION OF THE PRIOR ART

Interfaces are used in electrically testing an electronic component such as a computer chip (the "device under test" or DUT). The DUT is typically mounted on a round circuit board ("DUT board") which is clamped or otherwise held to the interface. The DUT board is then brought into contact with spring loaded contact pins (an example of which is referred to as "pogo pins") which are electrically connected to a tester. The pogo pins contact conductive pads on the circuit board. These pads are connected to terminals on the DUT.

Typically the DUT board is mounted on guide pins on the interface. The DUT board is then locked down using a large wrench such as a spanner wrench, or a vacuum system which is typically used to pull the DUT board toward the pogo pins within the interface, and to hold the DUT board against the pogo pins during testing. After testing the vacuum is released, and a spanner wrench or other large mechanical wrench is used to release the DUT board.

There are several problems inherent in the typical interfaces described above. It is awkward and time-consuming to use a spanner wrench or other mechanical wrench when inserting and removing the DUT board. Typical systems also tend to be heavy, weighing more than one person is able comfortably to carry around.

Further, the pogo pins are small and can be easily damaged. Pogo pins may be damaged when the DUT board is inserted into the interface, for example, by unintended contact with the DUT board or with tools used to install the DUT board. Damage to the pogo pins may also occur when the DUT board is brought into contact with them. Differential friction on the guide pins where the DUT board slides may cause the DUT board to "walk" (move first along one pin, and then along another) as it is moved by the vacuum system. This "walking," if it occurs when the DUT board is in contact with the pogo pins, has a tendency to damage the tips of the pogo pins.

Typical systems also have the shortcoming of pogo pins being difficult and time consuming to replace.

The vacuum systems typically used to hold the DUT board against the Pogo pins introduce the further problem of vibrations or fluctuations being transmitted or propagated to the interface from the vacuum pump.

Another problem with typical interfaces with vacuum systems is that they are limited as to the number of pogo pins they can utilize. Each pogo pin is spring loaded, and therefore the combined spring force of all of the pogo pins opposes any effort to bring the DUT board in contact with the pogo pins. The limited pressure available to a vacuum system therefore limits the number of pogo pins that can be used in such a system. This limitation increases in importance as increasing numbers of pogo pins are desired for testing more complicated electronic devices.

Another desirable feature for a test interface is that it propagates signals quickly from the DUT board to the tester. As microprocessors continue to increase in processing speed, it is increasingly desirable to increase the speed of signals to the tester, in order to better test such faster-running chips.

From the foregoing it will be seen that it would be desirable to improve the characteristics of test interfaces in several aspects.

SUMMARY OF THE INVENTION

A test interface is used to connect an electronic device under test ("DUT"), such as a computer chip, to a tester. The interface utilizes a combination of spring forces and air pressure forces to extend and retract pogo pins. The pogo pins when extended contact conductive pads which are electrically connected to the DUT, for example via a DUT board. Springs are biased to extend the pins to contact the pads, and air pressure is used to retract the pins. Thus no air pressure is required to maintain the pins in contact with the pads. When retracted, the pogo pins are shielded from damage by a shield, such as a board with holes in it for the pogo pins to pass through.

According to one aspect of the invention, a test interface has pins that are protected from damage during loading and unloading of DUT boards by a shield between the pins and where the DUT board is loaded and unloaded.

According to another aspect of the invention, a test interface has retractable pins, the pins being maintained in contact with a DUT or a DUT board by a mechanical force.

According to yet another aspect of the invention, a test interface has retractable pins which are biased by a spring force to an extended position.

According to another aspect of the invention, a test interface has pogo pins which are housed in carriers, the carriers being easily removable from the interface and the pogo pins being easily removable from the carriers.

According to still another aspect of the invention, a test interface has pogo pins which are terminated to wire conductors of coaxial cable, and fabricated with an insert molded structure to form a channel or sub-assembly. These sub-assemblies are grouped and retained in carriers, so that they can be removed and replaced easily. In addition to the replaceability of sub-assemblies, individual pogo pin contacts can be replaced.

According to a further aspect of the invention, a test interface includes pogo pin ends partially embedded in plastic bodies, the plastic bodies being made of a plastic with a low dielectric constant, such as a Teflon-doped plastic, which in conjunction with the geometry of the pogo pins and their sockets, will control impedance while increasing the speed of the signal while it propagates through the pogo pins.

According to a still further aspect of the invention, a test interface has a cover which is secured to the rest of the interface by securing pins on the interface which fit into slots on the cover. According to a particular embodiment the slots are T-shaped, with differently-sized segments of the "T" for securing DUT boards having different thicknesses.

According to another aspect of the invention, a test interface has parts made out of aluminum, thus saving weight in comparison to steel test interfaces.

According to yet another aspect of the invention, a method of testing an electronic device includes the steps of retracting pogo pins which are part of a test interface, mechanically coupling the device to the interface, and extending the pins to electrically connect the pogo pins and the device.

According to a further aspect of the invention, a method of testing an electronic device includes the steps of mechanically coupling the device to a test interface, electrically connecting the device and the interface by extending pogo pins which are part of the interface, and using a mechanical force to maintain the connection between the device and the pogo pins.

According to a still further aspect of the invention, a method of testing an electronic device includes the steps of shielding pogo pins by retracting them into openings in a shield, mechanically coupling the device to a test interface, and electrically connecting the device and the interface by extending the pogo pins.

According to another aspect of the invention, a test interface includes a cable with a construction which optimizes high speed performance including impedance control, low loss and low propagation delay.

According to yet another aspect of the invention, a test interface includes pogo pin bodies each having two or more pogo pins partially embedded therein, the bodies fitting into carriers such that the pogo pins are arranged in an opposite signal-ground pattern.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principals of the invention may be employed. Other objects, advantages and novel features of the invention will become apparent from the following detailed description of the invention when considered in conjunction with the drawings.

DETAILED DESCRIPTION OF THE PREFERRED EMBODIMENTS

Figure 1:
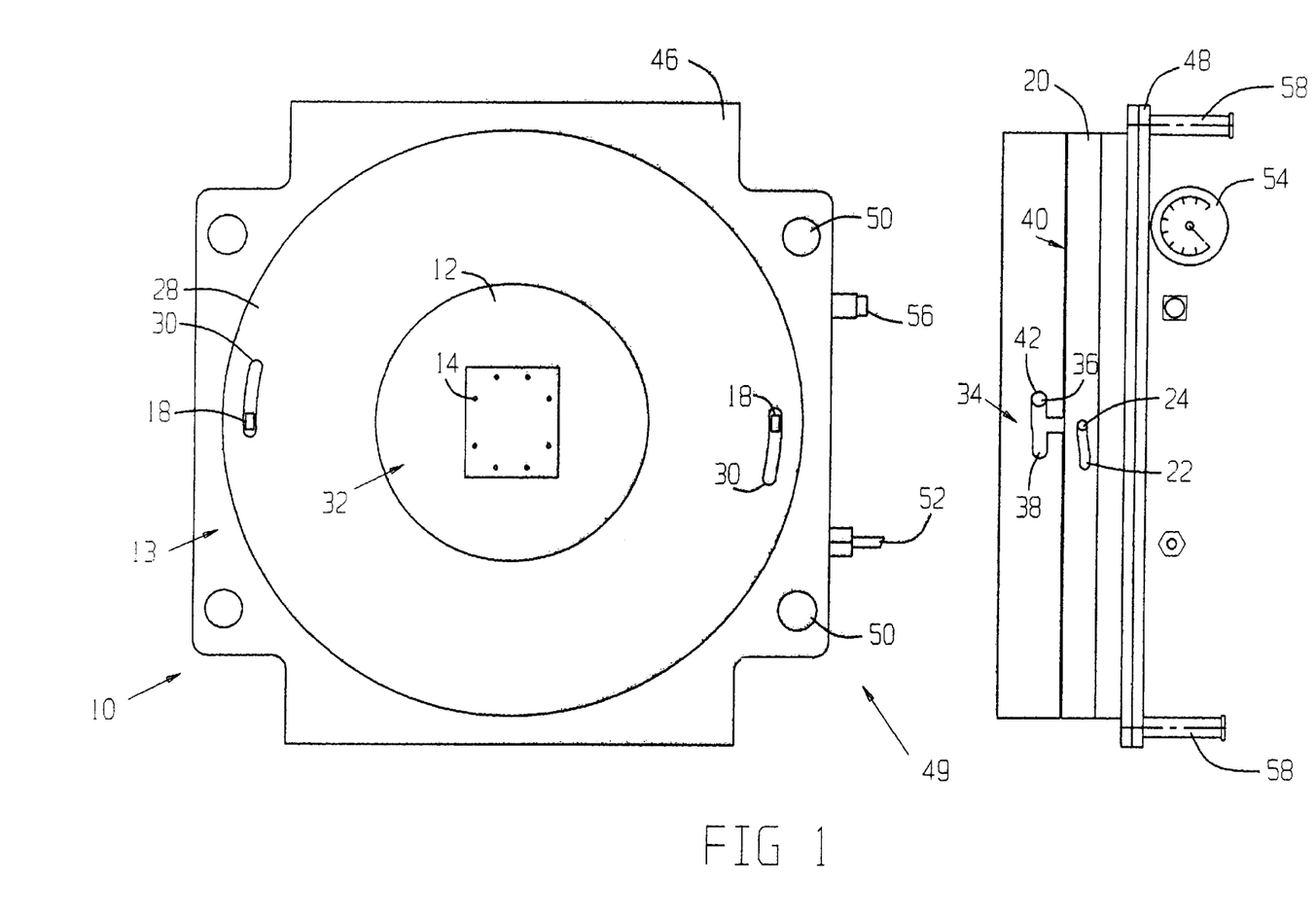
FIG. 1 is a schematic perspective view of a test interface in accordance with the present invention.
Figure 1A:
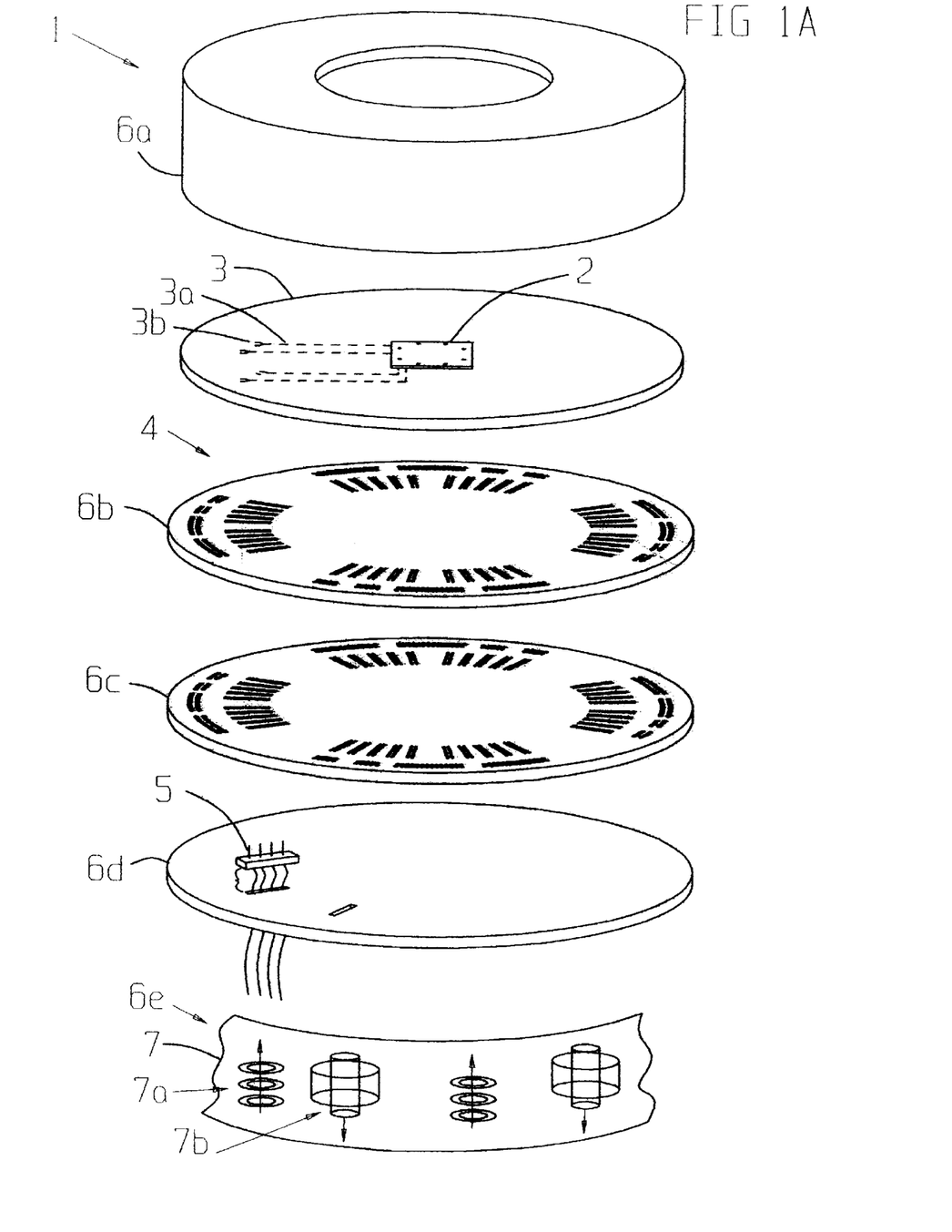
FIG. 1A is an exploded somewhat isometric schematic illustration of a test interface system in accordance with the present invention.

Briefly referring to FIG. 1A, an exploded somewhat isometric schematic illustration of a test interface system 1 in accordance with the present invention is shown. The several components of the system 1 are described in greater detail below with respect to the other drawing figures wherein various parts may be identified by different reference numerals than those shown in FIG. 1A.

The test interface system 1 is intended to make connections to an electronic component 2 (the device under test or DUT) for the purpose of testing operation of the DUT for any of various purposes, which testing is, of course, well known. With the increased number of circuits, functions, and portions of electronic components, it is desirable effectively and efficiently to provide many connections to the DUT. Usually the DUT is mounted on a circuit board, such as a printed circuit board 3 (sometimes referred to as a DUT board), which has conductive pads or the like electrically connected to respective conductive terminal pads or other types of terminals, leads, surface mount portions, etc. of the DUT, and the mentioned circuit board pads are coupled by printed circuit traces 3a or the like to test pads 3b. The test interface system 1 includes a test interface 4 which includes pogo pin connectors 5 (or other type of connector device) for electrical connection by mechanical engagement with the test pads 3b and, thus, electrical connection to the DUT. The pogo pins are coupled electrically be cable 5a or otherwise to a test instrument (not shown), and the test interface 4 has space to run the cable efficiently to the test instrument. Since there usually are many connections to be made to the DUT and, thus, many pogo pins, groups of pogo pins are positioned in respective carriers 5b and can be manipulated as a group to facilitate installation and removal for set up in a desired pattern, for replacing a damaged pogo pin, etc.

Several portions of the test interface 4 include a cover 6a placed over the DUT board 3 to hold it securely in place, a shield board 6b to protect the pogo pins, a middle board 6c, a backup plate 6d and a mounting/motion assembly generally represented at 6e. The pogo pin carriers 5b are mounted in the backup plate at desired locations, which may be altered according to the layout of the DUT board and which correspond with openings in the plates 6b and 6c and align pogo pins with respective pads 3b of the DUT board. An actuator system 7 of the mounting/motion assembly 6e includes spring actuators 7a and pneumatic actuators 7b; the spring actuators urge the backup plate and, thus, the pogo pins toward the DUT board for the pogo pins to connect thereto; the pneumatic actuators urge the backup plate and the pogo pins away from the DUT board out of electrical connection therewith.

Further details, interrelationships and interactions of the various parts of the system 1 are described in greater detail below.

Referring to FIG. 1, a test interface 10 is shown. The purpose of the interface 10 is to aid in electrically testing a device under test (DUT), e.g., a computer chip or other microprocessor. The DUT is mounted on a round circuit board, a DUT board 12, which is mounted and clamped in a housing 13 of the interface 10. Terminals on the DUT are connected via sockets 14 (surface mount contacts, connections, etc.) in the DUT board 12 to conductive pads on the board 12. Spring loaded contact pins ("pogo pins"), which are electrically connected to a tester via a ground plane interface, are pushed into contact with the conductive pads on the DUT board 12, the movement of the pogo pins being accomplished by use of springs and pressurized air, as described in greater detail below.

The DUT board 12 is clamped to the interface 10 by use of DUT board retainers or latches 1 8. The clamping and unclamping of the retainers or latches 18 are accomplished by rotation of a clamp ring 20, which causes movement of cam slots 22 in the clamp ring 20 relative to cam followers or tooling balls 24, thereby causing vertical movement of the tooling balls 24. The clamp ring 20 has finger grips cut in it to aid in its rotation. The cam followers or tooling balls 24 are connected to the retainers or latches 18, as described in greater detail below. These latches secure the DUT board 12 and allow the interface 10 to be moved and inserted in a test chamber before the cover 28 is installed.

A cover 28 is placed over parts of the DUT board 12 after the DUT board 12 is clamped to the interface 10. The cover 28 fits tightly across the DUT board 12, thereby resisting bowing in the DUT board 12 as the pogo pins are pushed upwards against the DUT board 12. The upward contact force from the pogo pins is distributed about the DUT board 12 according to the layout of contact pads on the board. In an example, such distribution of pads and pogo pins may be in a generally annular pattern about the board. In a exemplary embodiment, as many as 2500 pogo pins each exert approximately 70 grams of force on the DUT board 12; this translates to several pounds of total force on the DUT board. The cover 28 resists bowing that may be produced in the DUT board 12 by this load.

The cover 28 may be made of aluminum in order to save weight as compared to steel or other metals.

The cover 28 has slots 30 therein so that it does not press down on the retainers or latches 18. The cover 28 also has a central hole 32 therein to allow access to the sockets 14 of the DUT board 12.

The cover 28 is connected to the rest of the interface 10 by the interaction of four T-slots 34 and corresponding securing pins 36. The T-slots 34 each have a first segment 38 which is a different distance from bottom 40 of the cover 28 than a second segment 42. The segments 38 and 42 are offset at different distances to permit clamping of two different thicknesses of DUT boards. In an exemplary embodiment the difference in offset between the two segments 38 and 42 is 0.025". It will be appreciated that three or more different DUT-board thicknesses could be accommodated through use of a T-slot having segments with a more complicated shape.

The cover 28 is locked into place without the use of tools by the engagement of the T-slot 34 with the securing pins 36.

As the pogo pins later push upward on the DUT board 12 during testing of the DUT on the DUT board, the upward force on the DUT board 12 is transmitted to the cover 28. This upward force tightens the fit securement of the cover and DUT board and may deflect the cover 28 slightly, and, thus, prevents rotation and removal of the cover 28 when the pogo pins are engaged with the DUT board 12.

The tight fit of the cover 28 on the DUT board 12 also may provide an infrared light tight system, which may be important when using infrared light to test a device.

It will also be appreciated that the interface 10 may be made vacuum tight. Such a vacuum tight system is useful when using electron beams (E-beams) to examine a device under test.

Cylinder plate 46 and bottom plate 48 enclose a spring and pressurized air system 49 for moving the pogo pins, described in greater detail below. The cylinder plate 46 has depressions 50 therein to receive alignment posts which aid in locating the interface 10 within a test chamber (not shown).

Compressed air is supplied to the interface 10 from an external pressure supply via a fitting 52. A check valve (not shown) is connected to the fitting to block pressurized air from exiting through the fitting 52. A pressure gage 54 is used to monitor the pressure within the interface 10, and a bleed valve 56 is used to depressurize the system.

Isolator rods 58 are connected to the bottom plate 48. The rods 58 are part of a system to isolate the interface 10 from external vibrations, as described in greater detail below.

Figure 2:
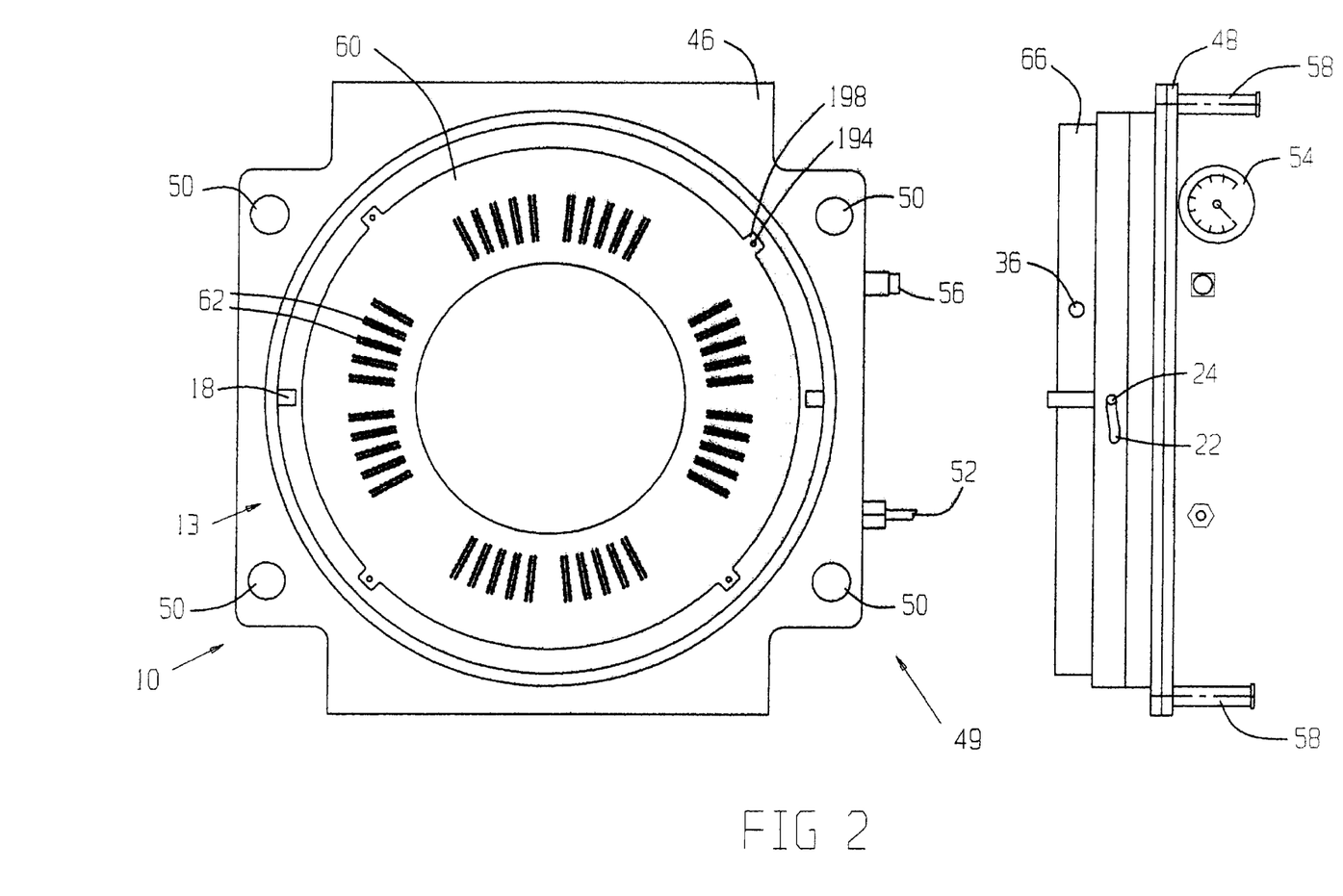
FIG. 2 is a schematic perspective view of the interface of FIG. 1 with the cover and some internal parts removed.

Referring to FIG. 2, the interface 10 is shown with the cover 28 and some other parts removed. A back-up plate 60 has slots 62 therein for receiving carriers containing the pogo pins, as described below.

Also shown in FIG. 2 is a main body ring 66 to which the securing pins 36 are connected, and to which the latches 18 are anchored, as described in greater detail below.

Figure 3A:
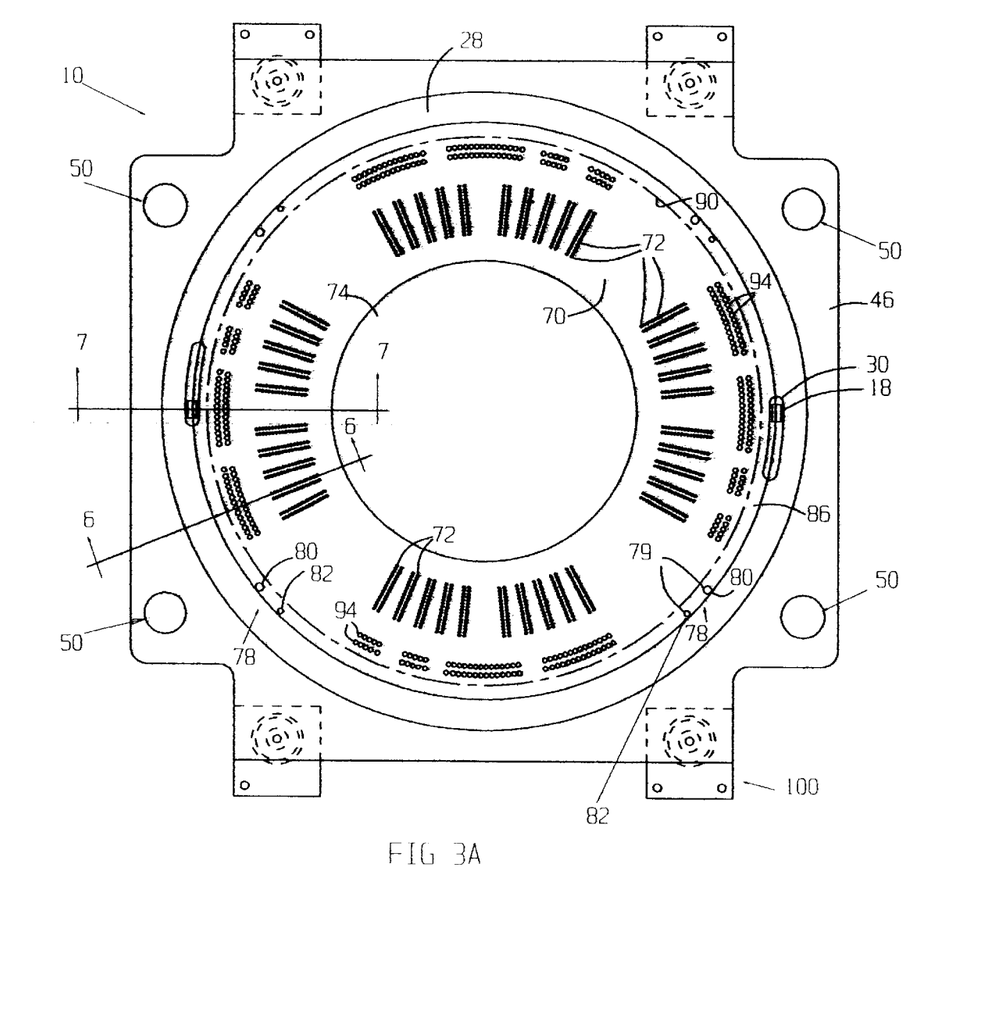
FIGS. 3A and 3B are plan and side elevation views, respectively, of the interface of FIG. 1.

Referring to FIG. 3A, a plan view of the interface 10 is shown. Beneath the cover 28 is a shield such as a shield board 70. The shield board 70 has pogo pin holes 72 therein which allow the tips of the pogo pins to protrude through when the pogo pins are in an extended position. When the pogo pins are retracted, the shield board 70 protects the tips of the pins from damage. The shield board 70 has a centrally-located hole 74, which may be aligned with the central hole 32 of the cover 28.

The shield board 70 has a series of circumferential holes 78 for positioning the board 70 relative to the main body ring 66 via a mating series of guide pins 79 protruding upward from the top of the main body ring 66. As shown in FIG. 3A, the series of holes 78 may include one hole offset. This encourages proper installation of the shield board 70.

Alternatively, proper installation of the shield board 70 may be encouraged by use of two sizes of holes, such as the larger holes 80 and the smaller holes 82 shown in FIG. 3A.

The guide pins 79 may also be used to mount the DUT board 12 upon the housing 13, although will be appreciated that other mounts for the DUT board 12 may be provided.

The shield board 70 rests upon top surface 86 of the main body ring 66, an inner edge 90 of which is shown in phantom in FIG. 3A.

Radially inward of the inner edge 90 are two rows of holes 94. These holes provide locations for power and ground pogo pins which are connected to the middle board.

The main parts of the interface 10, such as the cover, the main body ring, the clamp ring, the cylinder plate, the body plate, and the shield board, may be made of aluminum, which has a reduced weight when compared with steel. Alternatively, the interface parts may be made of steel or the like.

Figure 3B:
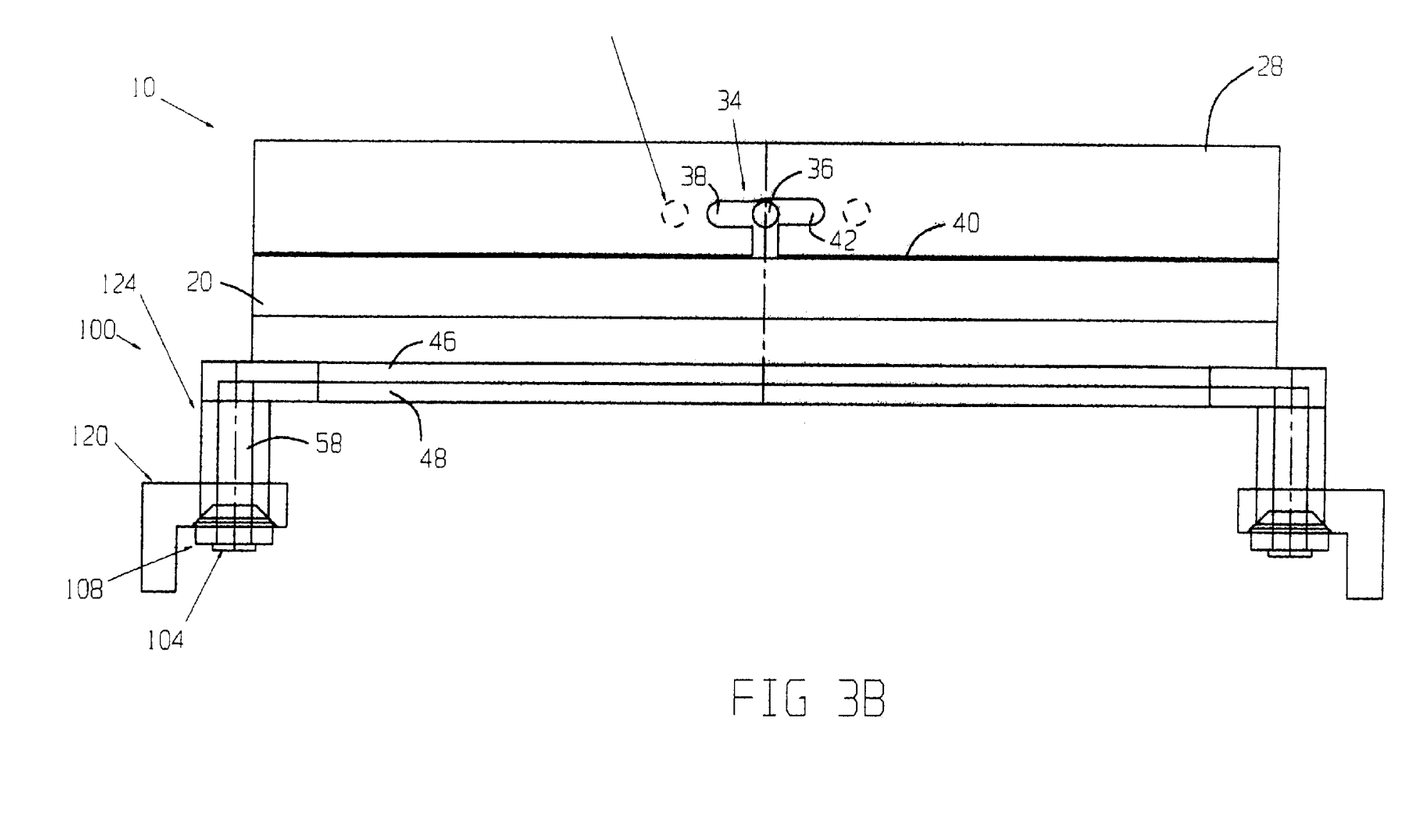
Figure 4:
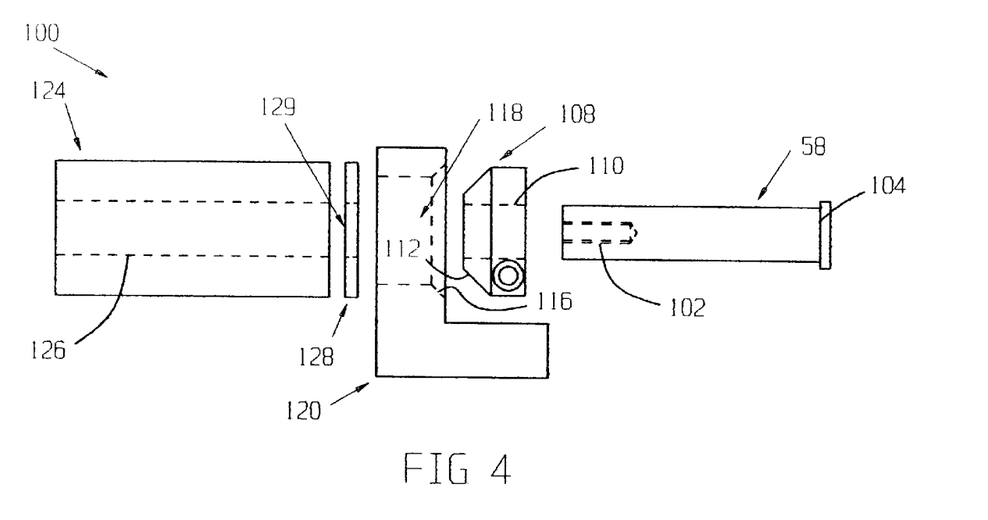
FIG. 4 is an exploded view of an isolator assembly of the interface of FIG. 1.

Referring to FIG. 3B, a side view of the interface 10 is shown which shows details of isolator assembly 100, which is also shown in exploded view in FIG. 4. The isolator rod 58 has a threaded hole 102 therein for connection to the cylinder plate 46 and the bottom plate 48. The isolator rod 58 also has a flange 104 at its opposite end. The flange 104 is used to retain an isolator collar 108 on the rod 58, the collar 108 having a central hole 110 therein so as to fit over the rod 58. The collar 108 has a sloped face 112 to contact a sloped face 116 in a central hole 118 of isolator bracket 120. A spacer block 124 is between the bracket 120 and the bottom plate 48. The block 124 has a central slot 126 to accommodate the rod 58.

One or more spacers such as spacer disk 128 with a hole 129 therein, may be placed between the block 124 and the bracket 120.

The rod 58 and the collar 108 may be made of stainless steel. The bracket 120 may be made of aluminum. The spacer block 124 may be a single piece, as shown. Alternatively the spacer block may be replaced in whole or in part with two or more disks stacked together. The spacer block may be made out of nylon, Delrin, or the like.

Figure 5:
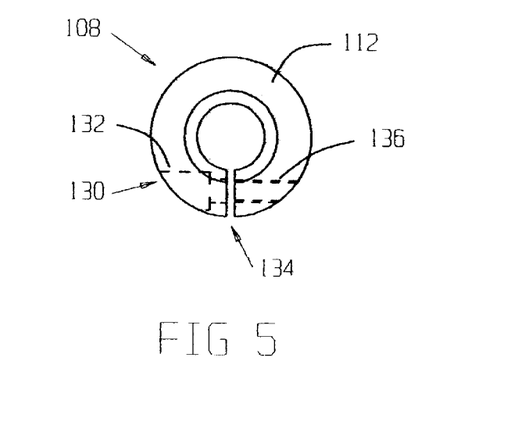
FIG. 5 is a plan view of the isolator collar used in the isolator assembly shown in FIG. 4.

The collar 108 may have a means of adjusting its size, as shown in FIG. 5. In the illustrated embodiment, the isolator collar 108 has a hole 130 therein. The hole 130 has an expanded portion 132 for receiving the head of a screw or bolt. The hole 130 is bisected by a radial slot 134. A portion 136 on one side of the slot 134 is tapped for receiving a screw or bolt. Tightening a screw or bolt in the hole 130 reduces the circumference of the isolator collar 108.

Figure 6:
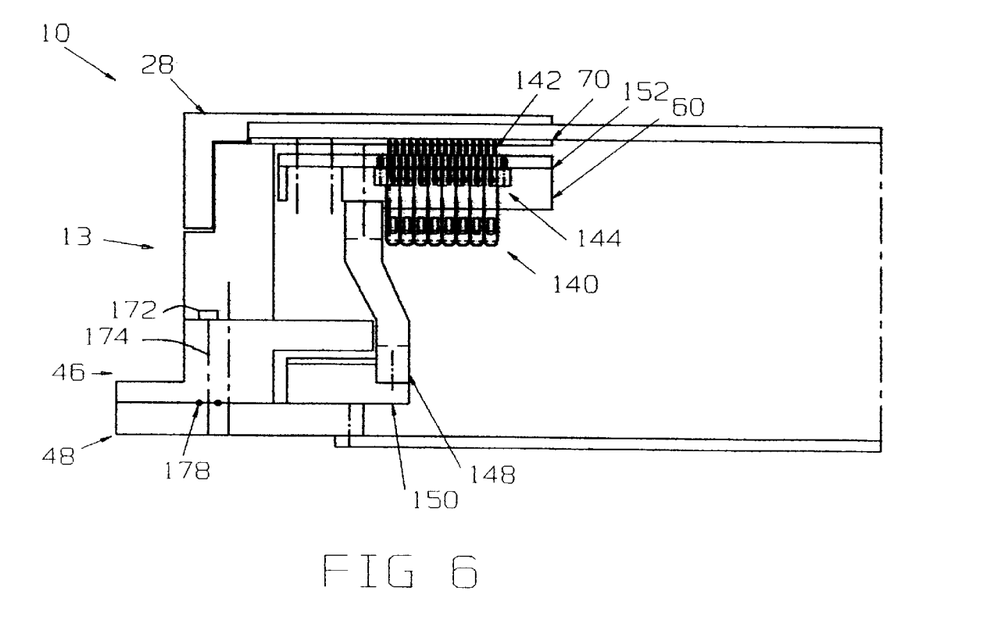
FIG. 6 is a fragmentary sectional view of the interface looking along section 6—6 of FIG. 3A.

Referring to FIG. 6, a pogo pin assembly 140 includes pogo pins 142 and a carriers 144 which hold the pogo pins 142 in a fixed positional relationship relative to one another. Each of the carriers 144 fits in one of the slots 62 of the back-up plate 60 (FIG. 2). The back-up plate 60 is attached to a push tube 148, which in turn is attached to a piston plate 150. Movement of the piston plate 150 in the vertical direction (as shown in FIG. 6) therefore produces vertical motion of the pogo pins 142. Also attached to the push tube 148 is a middle board 152, which is described in greater detail below.

Figure 7:
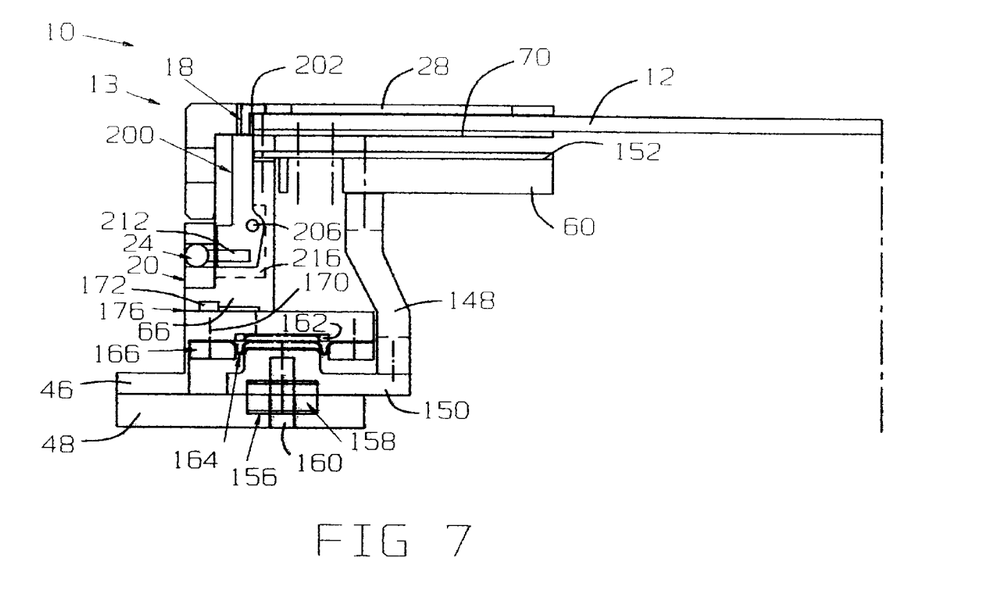
FIG. 7 is a fragmentary sectional view of the interface looking along section 7—7 of FIG. 3A.

Referring to FIG. 7, movement of the piston plate 150 is accomplished by means of spring forces and air pressure forces. The interface 10 includes twelve resilient biasing devices, such as springs 156. In an exemplary embodiment, the springs 156 are stacks of Belville washers 158 surrounding posts 160. The springs 156 are located between the bottom plate and the piston plate 150, in suitable depressions in the bottom plate 48 and the piston plate 150. The springs 156 are biased to push the bottom plate 48 and the piston plate 150 apart if their force is unopposed. Thus if there is no force to counter the action of the springs 156, the pogo pins 142 are extended upward, through the shield board 70, to contact the DUT board 12.

Retraction of the pogo pins 142 is effected by application of a downward force on the piston plate 150 through use of pressurized air by means of twelve diaphragms 164 equally circumferentially spaced and corresponding to the locations of the springs 156. The diaphragms 164 may be made of a pliant material such as rubber. The diaphragms 164 are held to the cylinder plate 46 by means cylinder clamp rings 166. The cylinder clamp rings 166 have holes therein through which screws or bolts or the like pass, the screws or bolts then passing through matching holes in the diaphragms 164 and into threaded holes in the cylinder plate 46.

Air pressure on the upper side, as shown in FIG. 7, of the diaphragm 164 pushes the diaphragm 164 downward. The pressure force on the piston plate 150 thereby causes movement of the piston plate 150 downward against the force of the springs 156. This causes retraction of the pogo pins 142.

Pressurized shop air is provided to the air chambers 164 via passages 170, which are shown schematically in FIG. 7 and are in communication with an annular air channel 172 in the main body ring 66. The air channel 172 in turn is connected to the fitting 52 (FIG. 1) through access passage 174 (shown schematically in FIG. 6). As explained above, the fitting 52 may be connected to a pressurized air source.

In use, shop air pressure is applied through the fitting 52, and a check valve attached to the fitting, 52 to the air chambers 162. The high pressure air in the air chambers pushes the diaphragms 164 downward to contact and push upon the piston plate 150, moving the piston plate 150 against the spring force of the springs 156 to bring the piston plate 150 in contact with the bottom plate 48. This retracts the pogo pins 142 slightly below the shield board 70, thus protecting the pogo pins 142 from damage when the cover 28 is open.

After the pogo pins 142 are retracted, the cover 28 is removed and the latches 18 are pivoted outward by rotating the clamp ring 20. The DUT board 12 is then installed on the guide pins 79 on the main body ring 66. The cover 28 is replaced and locked to the main body ring 56 by means of the T-slots 34 and the pins 36.

The interface 10 is then placed in a test chamber. The interface 10 is located in the chamber by mating four alignment posts with the depressions 50 in the cylinder plate 46 and/or with similar depressions in the bottom plate 48. Air pressure is then bled off slowly by opening the bleed valve 56. As the air pressure is bled off the springs 66 exert sufficient force to press the pogo pins 142 against the DUT board 12. The air supply can then be removed from the interface 10. The pogo pins 142 are extended during testing primarily by the force from the springs 156. There is no air pressure force on the system during testing. Thus the interface 10 is not subject to vibration during testing emanating from an air pressure or vacuum system.

Although the operation of the system is described above as involving removing the air supply from the interface 10 after the pogo pins 142 have been extended, it will be appreciated that the air supply could be removed before the bleed off of the air, since the check valve and the bleed valve 56 (when closed) maintain air pressure in the system.

Although the system has been described above as using twelve springs and twelve diaphragms in corresponding locations, it will be appreciated that a different number of springs and diaphragms may be used, that there may be a different number of springs than diaphragms, and that the springs and diaphragms need not be in corresponding locations.

It will be appreciated that other force-producing mechanical devices may be substituted for the resilient biasing device described above.

The use of a multiplicity of diaphragms and springs reduces the problem of "walking" that may occur for a less uniformly applied force. In addition, relatively high spring rates and frictionless diaphragm actuators reduce the problem of walking of the piston plate and the attached pogo pins. By illustration, if 0-ring piston actuators were used, there would be friction in the actuators, which would have a tenancy to break loose at different pressures, causing walking. This problem would be exacerbated if the springs opposing movement of the actuators had a low spring rate or spring constant, since an actuator restrained by a spring having a low spring rate requires only a small pressure to induce movement.

By contrast, a system having a higher spring constant requires a larger pressure difference to induce walking.

The air channel 172 is sealed against loss of pressure by means of a gasket 176, the gasket 176 having suitable holes therein to allow the air to pass through the passages 170 to the air chambers 162. The gasket 176 may be made of reinforced nylon, rubber, or the like.

The access passage 174 is sealed as it passes from the cylinder plate 46 to the bottom plate 48 by an O-ring 178.

The interface 10 may be inverted when in use, with the springs 156 holding the pogo pins 142 against the DUT board 12, and the cover 28 and the latches 18 securing the DUT board 12 within the interface 10.

Figure 8:
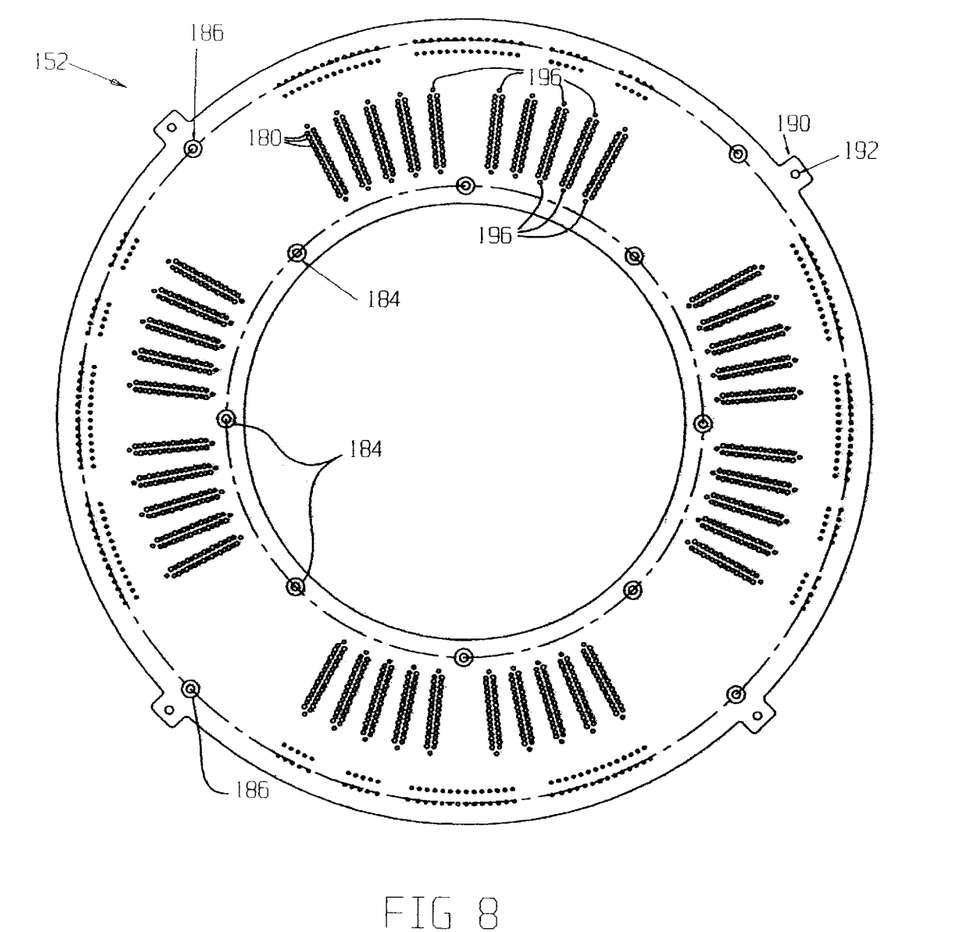
FIG. 8 is a plan view of a middle board in accordance with the present invention.

Referring to FIG. 8, details of the middle board 152 are shown. The middle board 152 has pogo pin holes 180 to allow passage of the pogo pins 142 therethrough. In addition, the middle board 152 has inner mounting holes 184 and outer mounting holes 186 for mounting the middle board 152 to the back-up plate 60. Four tabs 190 with tab holes 1 92 are provided the middle board 152 to connect with mating pins 194 and recesses 198 in the main body ring 66 (FIG. 2).

The middle board 152 also has guide holes 196 therein to aid in placement of the carriers 144 holding the pogo pins 142, as described in greater detail below.

Figure 9:
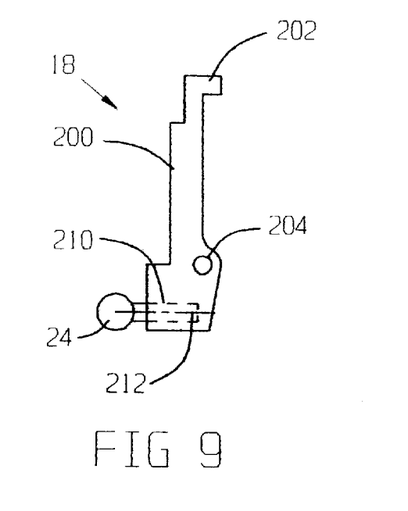
FIG. 9 is side view showing a retainer or latch in accordance with the present invention.

FIG. 9 illustrates details of the retainer or latch 18. The latch 18 has a body 200 with a grip 202 for holding the DUT board 12. The body has a hole 204 therethrough for passage of a dowel pin 206 (FIG. 7) through the body 200. The dowel pin 206 pivotally connects the latch 18 to the main body ring 66. The body 200 has an opening 210 therein into which a shank 212 is press fit. The shank 212 is attached to the tooling ball 24 which in turn follows the cam slot 22, as best shown in FIG. 1.

As best shown in FIG. 7, the latch 18 rotates within a cavity 216 in the main body ring 66. Upward movement of the tooling ball 24 causes the grip 202 of the latch 18 to move radially inward. Conversely, downward movement of the tooling ball 24 causes the grip 202 to move radially outward, releasing the DUT board 12.

Figure 10A:
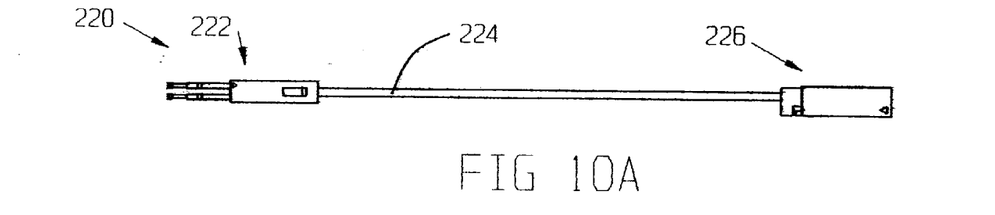
FIGS. 10A and 10B are plan and side views, respectively, of a cable assembly in accordance with the present invention.
Figure 10B:
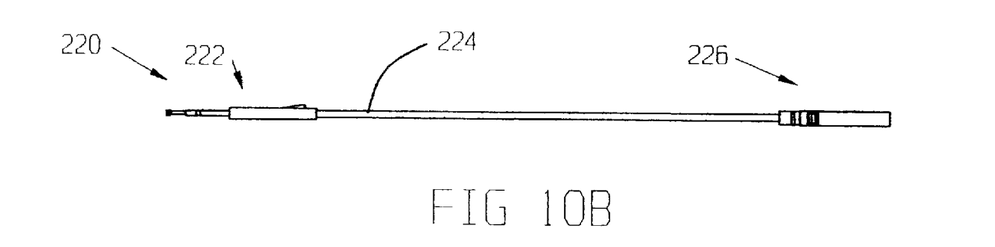
Figure 11:
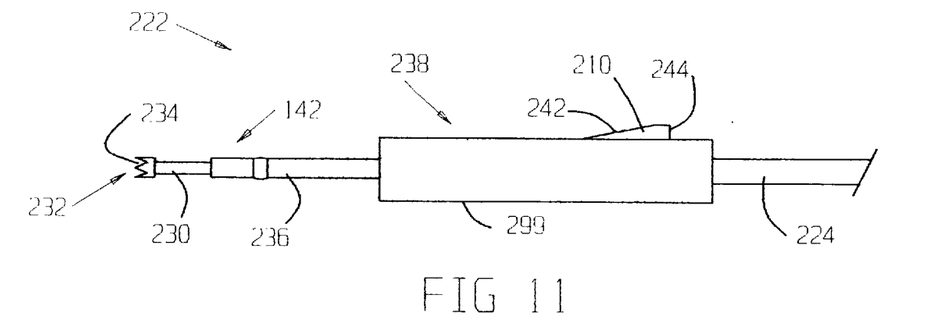
FIG. 11 is a side view showing details of the pogo pin end of the cable assembly of FIGS. 10A and 10B.

Referring to FIGS. 10A, 10B and 11, a cable assembly 220 includes a pogo pin end 222, a cable 224 and a ground plane interconnect (GPI) end 226.

The cable 224 may be made using a wire with an extra thick silver plating to increase signal propagation speed. A significant reduction of signal loss is also experienced with the wire having extra thick silver plating, as compared to standard co-ax cable.

The pogo pin end 222 includes two pogo pins 142. Each of the pogo pins includes a shaft 230 with a contact end 232 having teeth 234. The teeth 234 are used to better engage the conductive pads on the DUT board 12. The pogo pins 142 are slidable within sleeves 236, with a spring (not shown) biasing the pogo pins 142 in an outward position.

The pogo pins 142 and the sleeves 236 are partially embedded in a pogo end body 238. The pogo end body 238 may be made of a non-conducting material, such as plastic or the like, and may be overmolded onto the pogo pins 142 and the sleeves 236. The pogo end body 238 has a ramp 240 with an inclined surface 242 and a perpendicular surface 244. The ramp 240 is used to connect the pogo pin end 222 to the carrier 144, as described below.

The pogo pins 142 are electrically connected to the cable 224, and thereby also to the GPI end 226.

Although the cable assembly 220 of the illustrated embodiment has two pogo pins per cable assembly, it will be appreciated that alternatively a greater or lesser number of pogo pins per cable assembly may be employed.

Figure 12A:
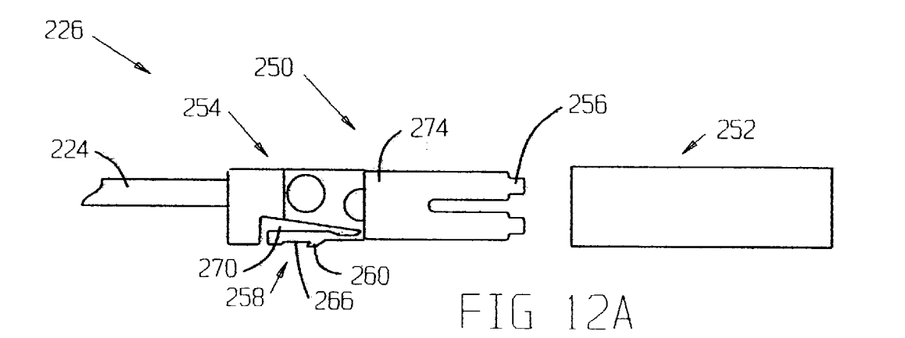
FIGS. 12A and 12B are plan and side exploded views, respectively, of the ground plane interconnect end of FIGS. 10A and 10B.
Figure 12B:
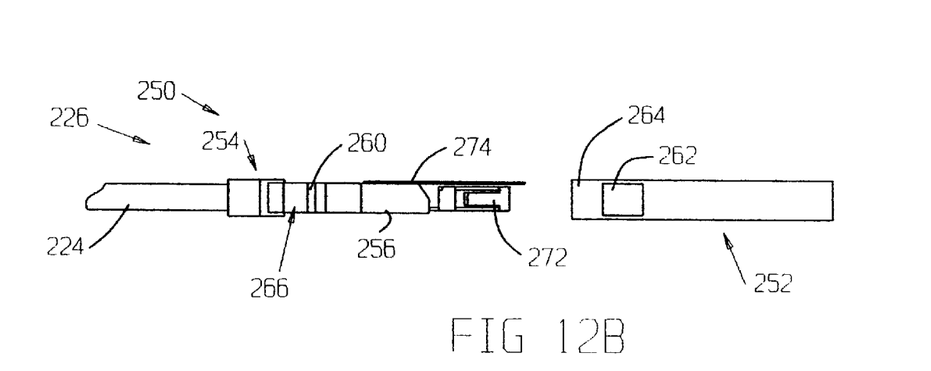

Referring to FIGS. 12A and 12B, details of the GPI end 226 are shown. The GPI end 226 includes an electrical connect portion 250 and a cover 252. The electrical connect portion has a body 254, made out of a non-conducting material such as plastic or the like, and conducting leads 256, which are electrically connected with the cable 224. The body 254 has a deformable latch 258, which releasably engages the cover 252. The latch 258 has a wedge 260 thereon which protrudes through cut-out 262 in the cover 252 when the cover 252 is engaged with the electrical connect portion 250. When so engaged, a securing bar 264 on the cover 252 fits in a notch 266 on the deformable latch 258. The cover 252 is released from the electrical connect portion 250 by pressing the deformable latch 258 inward into an open space 270 until the wedge 260 is sufficiently recessed for the securing bar 264 to clear the wedge 260, thus enabling the cover 252 to slide off the electrical connect portion 250.

The electrical connect portion 250 also includes inward-bent tabs 272 for contacting pins from a suitable mating connector. An electrical shield 274 is provided on the electrical connect portion 250 in order to shield the leads 256 from electrical interference due to signals from leads in adjacent GPI ends, or from other sources. The shield 274 is mechanically and electrically attached to the leads 256.

Figure 13:
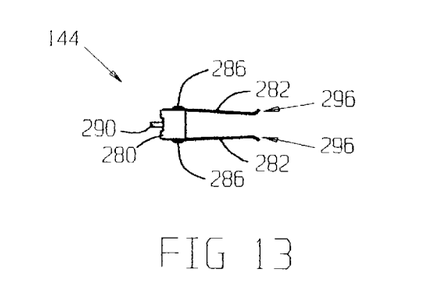
FIG. 13 is side view of a carrier of the present invention.
Figure 14A:
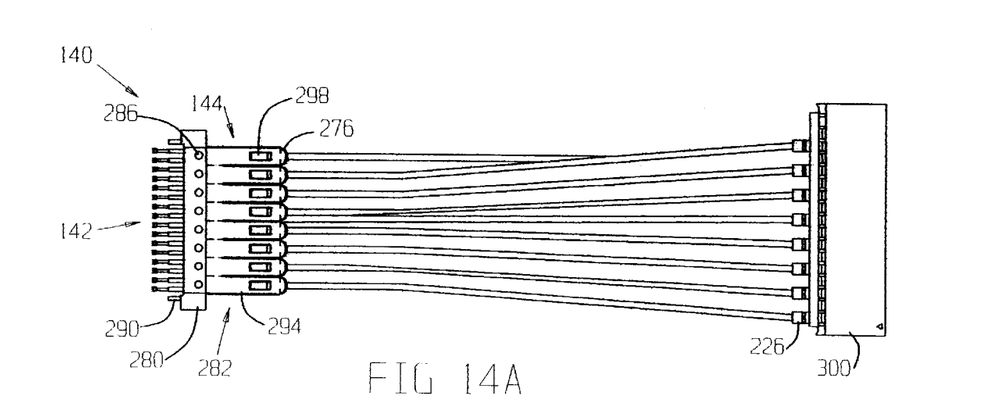
FIGS. 14A and 14B are plan and side views, respectively, of cable assemblies of the present invention connected to carriers and ground plane interconnects.
Figure 14B:
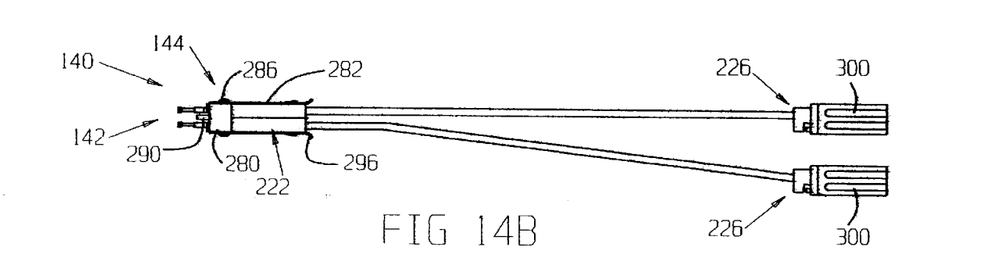

Referring to FIGS. 13, 14A and 14B, the pogo pin ends 222 are inserted into the carrier 144 to form the pogo pin assembly 140. The carrier 144 includes a housing 280 and compliant sides 282 attached to the housing 280. The compliant sides 282 may be made of metal and may have holes 284 therein for mating with corresponding protrusions 286 on the housing 280. The housing 280 may be made of plastic, and the protrusions 286 may be heated and flattened against the slides 282, thereby securing the slides 282 against the housing 280. Alternatively, the slides 282 may be secured to the housing by otherwise deforming the protrusions 286, or by other means.

The compliant sides 282 also provide electrical shielding for the pogo pin ends 222 within the carrier 144.

The housing 280 has guide pins 290 protruding therefrom in the same direction as the pogo pins 142. The guide pins 290 mate with the guide holes 196 in the middle board 152 (FIG. 8).

It will be appreciated that the guide holes 196 in the middle board 152 and the guide pins 290 of the carrier 144 may be arranged so that the carriers 144 fit into the middle 152 board in only one direction.

The slides 282 angle inward from the sides of the housing 280, as shown in FIG. 13. Thus they must be pushed apart to insert the pogo pin ends 222. The slides 282 have tabs 294 with curved ends 296. The tabs 294 may be pushed apart individually as the pogo pin ends 222 are inserted. The curved ends 296 tend to urge the pogo pin ends 222 between the compliant slides 282.

The tabs 294 also have latch windows 298 for retaining inserted pogo pin ends 222. As one of the pogo pin ends 222 is inserted into the carrier 144 the inclined surface 242 of the ramp 240 of the pogo pin end 222 pushes one of the tabs 294 outward. As the ramp 240 fully enters the latch window 298, the tab 294 snaps back, and the pogo pin end 222 is held in place, the pogo pin end 222 being prevented from being pulled out because the perpendicular surface 244 of the ramp 240 is held by the portion of the tab 294 around the latch window 298. If removal and/or replacement of the cable assembly 220 is desired, the appropriate of the tabs 294 may be moved further outward, allowing the perpendicular surface 244 the ramp 240 to clear the latch window 298. The pogo pin end 222 may then be removed from the carrier 144.

The placement of the ramp 240 on only one side of the pogo end body 238 facilitates proper installation of the pogo pin ends 222 into the carrier 144, because installing one of the pogo pin ends 222 with lower surface 299 of the pogo end body 238 facing one of the compliant slides 282 would be noticeable in that the protrusion 240 would not lock in the latch window 298, and the protrusion 240 would contact the abutting pogo pin end 222, blocking insertion of the pogo pin end 222.

One of the pogo pins 142 of each of the cable assemblies 220 is grounded. The other of the pogo pins 142 carries a signal. It is desirable that the grounded of the pogo pins 142 be located in the same relative location within each of the cable assemblies 220. This allows the pogo pins 142 to be isolated such that a grounded pogo pin is between signal pogo pins of adjacent of the cable assemblies 220. Because of the way that the ramp 240 is located on the pogo end body 238, the cable assemblies 220 which have back-to-back pogo pin ends 222 necessarily have pogo pins which are arranged in an opposite signal-ground pattern, so that a ground is always next to a signal.

Individual of the cable assemblies 220 may be removed from the carrier 144 and replaced, if desired. In addition, it will be appreciated that the carriers 144 may be easily removed from the middle board 152 if necessary to replace an entire carrier or an individual cable assembly which is part of a carrier.

The GPI ends 226 of the cable assemblies 220 are inserted into ground plane interconnects 300, which are connected to a tester for electrically testing the DUT.

It is desirable to increase the speed of the signal by reducing the dielectric constant of the material around the pogo pins. Typical plastics molded around signal terminations have a dielectric constant in the range of approximately 3.6 to 4. Air, by contrast, has a dielectric constant of 1. Therefore it is desirable to reducing the amount of plastic used in the pogo pin and GPI ends, surrounding more of the ends with air.

Another way of reducing the dielectric constant is by changing the plastic used in the ends to one having a lower dielectric constant. Manufacturers of plastic have produced compounds doped with Teflon, generally for friction reduction. This Teflon doping of plastic has been found to have the beneficial side effect of reducing the dielectric constant of the plastic. Therefore it is desirable to substitute Teflon-doped plastic for the plastic generally used in terminations.

It is desirable in terms of reducing the dielectric constant of the plastic for the plastic to have at least a 10% fill of Teflon material. It is preferable for it to have at least a 25% fill of Teflon material, and perhaps as much as a 50% fill of Teflon material.

Referring to FIGS. 15A, 15B, and 16–18, an alternate embodiment cable assembly 320 with a pogo pin end 322 is shown. The pogo pin end 322 is similar to the pogo pin end 222 except as described below.

Figure 15A:
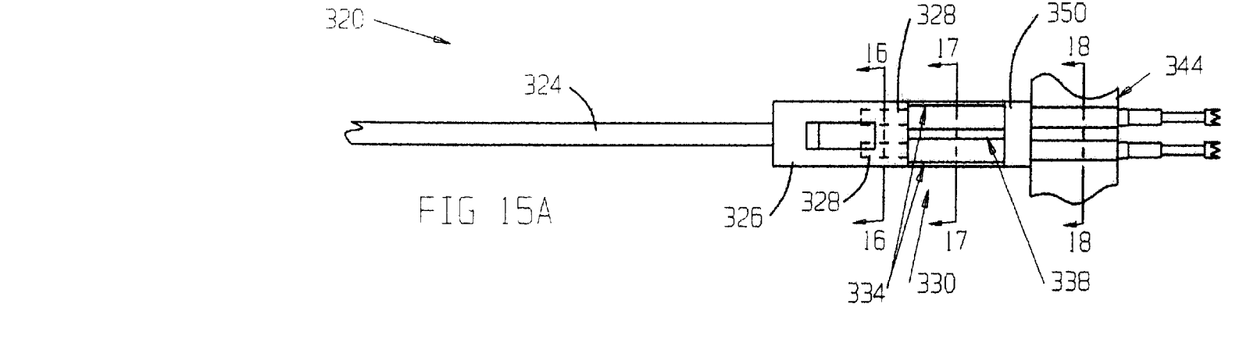
FIGS. 15A and 15B are plan and side views, respectively, of an alternate embodiment cable assembly in accordance with the present invention.
Figure 15B:
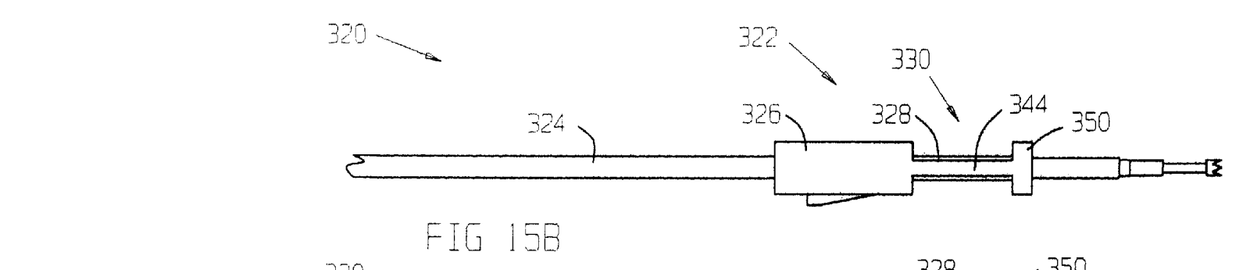

A cable 324 is attached to a pogo pin body 326, which may be made of Teflon-doped plastic. Electrical leads 328, which may be enclosed in sleeves, are connected to wires from the cable 324 within the body 326.

Figure 16:
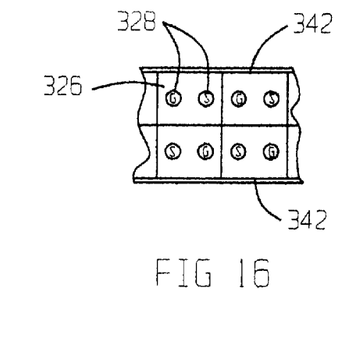
FIG. 16 is a sectional view of the cable assembly of FIGS. 15A and 15B looking along section 16—16 of FIG. 15A.
Figure 17:
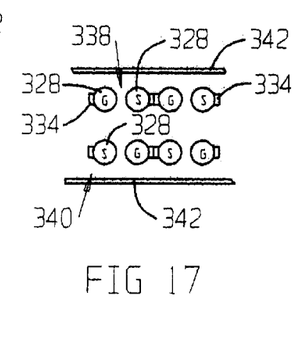
FIG. 17 is a sectional view of the cable assembly of FIGS. 15A and 15B looking along section 17—17 of FIG. 15A.
Figure 18:
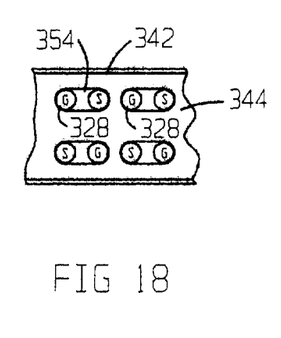
FIG. 18 is a sectional view of the cable assembly of FIGS. 15A and 15B looking along section 18—18 of FIG. 15A.

The leads 328 pass through a middle section 330 of the pogo pin end 322, the middle section 330 having no support structure other than plastic ribs 334. The middle section 330 has an air space 338 between the leads 328 and air in the area 340 between the leads 328 and compliant sides 342 of a carrier 344. Thus a minimum amount of plastic and a maximum amount of air surrounds the leads 328 in the middle section 330.

Thereafter the leads 328 go through a solid plastic section 350.

Thereafter the leads 328 pass through slots 354 in the carrier 344, the slots 354 designed such that two of the leads 328 pass through each of the slots 354.

Since impedance, conductance, and capacitance are all interrelated, increasing the conductance in the vicinity of the ends by reducing the dielectric constant of the material around the signal lines can increase the impedance. The sleeves 328 may be used to control impedance of the pogo pin end. This is done by varying the diameter and/or the length of the sleeves 328.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such equivalents, alterations, modifications and variations that fall within the spirit and scope of the appended claims.

What is claimed is:

1. A test interface to connect an electronic device under test ("DUT"), comprising contacts contactable with the DUT, at least one spring to urge the contacts to contact the DUT, and a pressurized gas system to withdraw the contacts out of engagement with the DUT, wherein the pressurized gas system includes plural circumferentially spaced-apart chambers.

2. The test interface of claim 1, wherein the at least one spring includes two or more circumferentially spaced-apart springs.

3. The test interface of claim 2, wherein the springs include stacks of Belleville washers.

4. The test interface of claim 1, wherein the pressurized gas system further includes fluid passages linking the chambers.

5. The test interface of claim 4, wherein the fluid passages include an annular channel.

6. The test interface of claim 5, wherein the pressurized gas system further includes plural diaphragms, each of the diaphragms corresponding to respective of the chambers.

7. The test interface of claim 6, wherein the at least one spring includes two or more circumferentially spaced-apart springs.

8. The test interface of claim 7, wherein the springs include stacks of Belleville washers.

9. The test interface of claim 8, further comprising posts, and wherein each of the stacks of Belleville washers encircles a respective post.

10. The test interface of claim 6, wherein each of the chambers corresponds to respective of the stacks of Belleville washers.

11. A method for connecting and disconnecting contacts to an electronic device under test ("DUT"), comprising using spring force to urge the contacts to contact the DUT, and using a pressurized gas force to withdraw the contacts out of engagement with the DUT, wherein using the pressurized gas force includes providing pressurized gas to plural circumferentially spaced-apart chambers.

12. A method of testing a device under test, mounted on a test structure, comprising using resilient force to urge the device under test to engage electrical test contacts, performing tests on the device under test, and using pressurized gas to release the device under test from the test contacts, wherein the using the pressurized gas includes providing the gas to circumferentially spaced-apart chambers.

13. The method of claim 12, wherein the using resilient force includes generating the resilient force using stacks of Belleville washers.

14. The method of claim 12, wherein the using resilient force includes generating the resilient force using circumferentially spaced-apart springs.

* * * * *